United States Patent [19]
Hissen

[11] Patent Number: 6,097,253
[45] Date of Patent: Aug. 1, 2000

[54] HIGH SPEED PROCESS-CONTROLLED TRANSRESISTANCE AMPLIFIER

[75] Inventor: Jurgen Hissen, Coquitlam, Canada

[73] Assignee: PMC-Sierra Ltd., Burnaby, Canada

[21] Appl. No.: 09/248,903

[22] Filed: Feb. 12, 1999

[51] Int. Cl.[7] ............................................ H03F 3/16
[52] U.S. Cl. ................................. 330/277; 330/296
[58] Field of Search ........................... 330/277, 296; 327/97

[56] References Cited

U.S. PATENT DOCUMENTS

| | | | |
|---|---|---|---|
| 5,061,907 | 10/1991 | Rasmussen | 331/57 |
| 5,241,283 | 8/1993 | Sutterlin | 330/296 |
| 5,331,295 | 7/1994 | Jelinek et al. | 331/57 |
| 5,708,385 | 1/1998 | Shou et al. | 327/361 |
| 5,994,963 | 11/1999 | Kawai et al. | 330/296 |

OTHER PUBLICATIONS

"A 500Mb/s, 20–Channel CMOS Laser Diode Array Driver for a Parallel Optical Bus", Xiao et al, 1997 IEEE Intl. Solid–State Conf., pp. 250–251.

*Primary Examiner*—Michael B Shingleton
*Attorney, Agent, or Firm*—Oyen Wiggs Green & Mutala

[57] ABSTRACT

A high speed, low-power transresistance amplifier incorporating a threshold-biased, current-mode feedback inverter. Starvation transistors are connected between the inverter's power supply terminals and the supply. Capacitors are connected between the power supply and the nodes at which the starvation transistors are connected to the inverter to bypass the starvation transistors and decrease the AC impedance of the nodes, as seen by the inverter. A resistive network connected between the starvation transistors and a bias voltage supply decreases the effective DC impedance of the nodes.

9 Claims, 2 Drawing Sheets

Figure 1: Prior art

HIGH SPEED PROCESS-CONTROLLED TRANSRESISTANCE AMPLIFIER

TECHNICAL FIELD

This invention pertains to a transresistance amplifier having a high speed threshold-biased inverter, with crowbar current through the inverter being controlled to prevent excess power dissipation at "fast" process corners.

BACKGROUND

A transresistance amplifier is an amplifier which supplies an output voltage signal in proportion to an input current signal. The transfer function of a transresistance amplifier is $e_o/I_m = R_m$ where $R_m$ is the transresistance. Ideally, a transresistance amplifier achieves high speeds while simultaneously preventing excess power dissipation.

An important factor affecting the level of power dissipation in an amplifier is the characteristics of the integrated circuit transistors which form the amplifier. Integrated circuit fabrication processes introduce unavoidable "process" variations which the amplifier designer must anticipate and compensate for. Transistors fabricated on different silicon wafers and/or on different dice fabricated from a single wafer inevitably exhibit process variations which affect the transistors' operating characteristics. For example, process variations may result in differences in the propagation delays of electronic signals processed through separate, supposedly "identical" circuits. The propagation delay of a switching element in a "slow" process can be approximately double that in a "fast" process. In this context, a "slow" process is a fabrication process which yields switching elements exhibiting significantly greater propagation delays than those exhibited by switching elements fabricated in a "fast" process.

Propagation delays also change with variations in power supply levels, since the operating points of integrated circuit devices fluctuate as power supply levels change. Accordingly, power supply changes can also affect the power consumption of the circuitry. The term "fast process/supply corner" is used herein to characterize variations exhibited by devices of atypically high conductivity and/or devices which must endure atypically high power supply levels (which are nevertheless within acceptable limits). Similarly, the term "slow process/supply corner" is used herein to characterize variations exhibited by devices of atypically low conductivity and/or devices which must endure atypically low power supply levels (which are nevertheless within acceptable limits).

In addition to affecting propagation delay, process variations can also affect the power dissipated by a circuit, since they directly affect the conductivities of the devices which make up a circuit. Designing an amplifier incorporating devices having predefined speed and power characteristics is problematic, in that the designer must make the devices large and fast enough to satisfy the speed constraint at the slowest possible process corner, while enduring increased power consumption at the fastest, most "power-hungry" process corner.

U.S. Pat. No. 5,708,385 Shou et al discloses a typical transresistance amplifier. Shou et al provide a plurality of series-connected inverters, with a feedback resistor coupled between the output of the last inverter stage and the input of the first inverter stage. Considerable "crowbar current" flows through the cascaded inverters, resulting in unwanted power dissipation. (Crowbar current is somewhat analogous to the current characteristic of a crowbar overvoltage protection circuit as is commonly used in power electronics to rapidly short circuit a power supply by placing a low resistance shunt across the power supply output terminals if a predetermined voltage threshold is exceeded.) The Shou et al cascaded inverter structure is comparable to a stack of two MOS diodes between the supplies. Considerable crowbar current (several milliamps) flows through such a structure. The present invention significantly reduces the effect of such current on the power supplies, minimizing unwanted power dissipation.

More particularly, at zero input current, the operating point of the Shou et al circuit is at the switching threshold of the inverter circuit. This causes considerable crowbar current to flow through the inverters, resulting in undesirable power dissipation. Further, to achieve significant speed and drive strength at the slow process/supply corner, the dimensions of the integrated circuit transistors forming each inverter must exceed some calculable minimum values. But, transistors which satisfy such dimensional constraints exhibit undesirable power dissipation at the fast process/supply corner.

U.S. Pat. No. 5,331,295 Jelinek et al discloses a technique for limiting current flow through a plurality of series-connected complementary-symmetry metal-oxide-semiconductor ("CMOS") field effect transistor inverters. A current control "starvation" transistor is coupled above and below each inverter. The starvation transistors effectively reduce the power supply voltage seen by the inverters and can be used to vary the signal propagation delay through the series-cascaded inverters. A higher power supply voltage seen by the inverters tends to reduce the propagation delay through them. This property is exploited by Jelinek et al to tune the oscillator frequency. However, the circuit of Jelinek et al does not provide transresistance functionality. Even if, as taught by Shou et al, a feedback resistor were provided in the circuit of Jelinek et al, such circuit would still not provide transresistance functionality, due to the current source operation of the starvation transistors, which would lower the voltage gain of the inverters.

The present invention provides a transresistance amplifier which overcomes the foregoing disadvantages.

SUMMARY OF INVENTION

The invention provides a high speed, low-power transresistance amplifier incorporating a threshold-biased, current-mode feedback inverter. Starvation transistors are connected between the inverter's power supply terminals and the power supply. Capacitors are connected between the power supply and the nodes at which the starvation transistors are connected to the inverter such that the capacitors bypass the starvation transistors and decrease the AC impedance of these nodes, as seen by the inverter. A resistive network connected between the starvation transistors, the inverter's input, and a bias voltage supply decreases the effective DC impedance of the nodes.

DESCRIPTION

Figure 1:
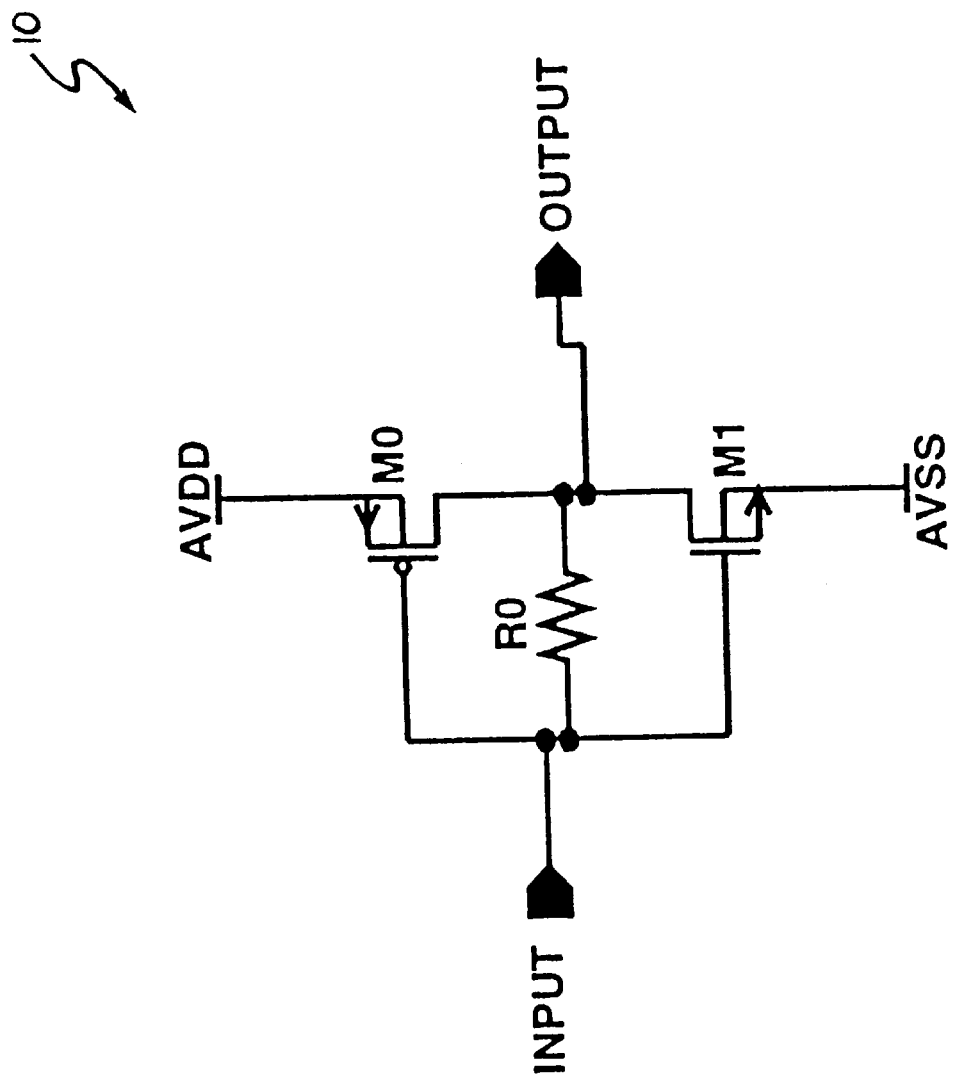
FIG. 1 is an electronic circuit schematic diagram of a typical prior art transresistance amplifier.

FIG. 1 depicts a typical prior art CMOS transresistance amplifier with current mode feedback. The amplifier comprises a CMOS inverter 10, formed by a p-channel metal-oxide semiconductor ("PMOS") field effect transistor M0, the source of which constitutes a first voltage supply terminal and is electrically connected to positive DC power supply voltage source AVDD, and an n-channel metal-oxide semiconductor ("NMOS") field effect transistor M1, the source of which constitutes a second voltage supply terminal and is electrically connected to a ground potential AVSS. The input of inverter 10 is electrically connected to the gates of both transistors M0, M1; and, the output of inverter 10 is electrically connected to the drains of both transistors M0, M1. Inverter 10 has high gain and is capable of fast switching speeds. Resistor R0 provides current-mode feedback between the output and input of inverter 10, and provides a transresistance gain which is reasonably constant over process or power supply variations.

At zero input current, the operating point of the FIG. 1 prior art amplifier is at the switching threshold of inverter 10. This causes considerable crowbar current to flow through inverter 10, resulting in unwanted power dissipation. Moreover, due to the aforementioned integrated circuit process variations, inverter 10 must be sized to ensure correct timing of output signals in a slow process. To achieve sufficient speed and drive strength at the slow process/supply corner, the dimensions of integrated circuit transistors M0, M1 must exceed calculable minimum values. But, transistors which satisfy such dimensional constraints exhibit undesirable power dissipation at the fast process/supply corner.

Figure 2:
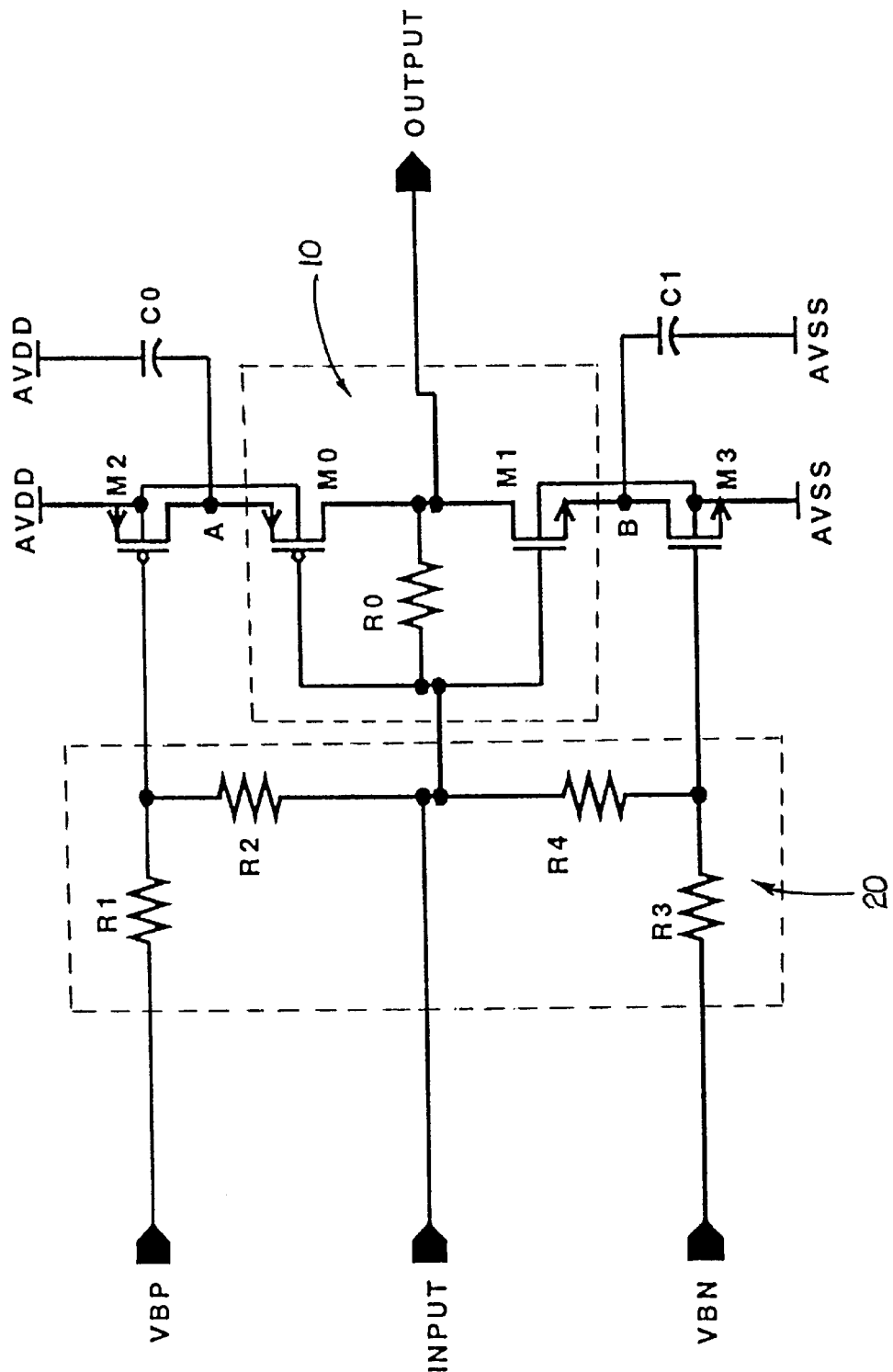
FIG. 2 is an electronic circuit schematic diagram of a preferred embodiment of the invention.

FIG. 2 depicts a preferred embodiment of a transresistance amplifier according to the present invention. The components comprising the FIG. 1 inverter 10 (i.e. transistors M0, M1 and resistor R0) are enclosed within a dashed outline in FIG. 2. PMOS field effect starvation transistor M2 is connected between inverter 10 and the positive DC power supply voltage source AVDD. Node "A", the point of connection between the drain of transistor M2 and the source of transistor M0, constitutes a first voltage supply terminal of inverter 10. NMOS field effect starvation transistor M3 is connected between inverter 10 and the ground potential AVSS. Node "B", the point of connection between the drain of transistor M3 and the source of transistor M1, constitutes a second voltage supply terminal of inverter 10. Resistor R2 is connected between the gate of transistor M2 and the input of inverter 10, and resistor R1 is connected between the gate of transistor M2 and an externally generated bias voltage VBP. Similarly, resistor R4 is connected between the gate of transistor M3 and the input of inverter 10, and resistor R3 is connected between the gate of transistor M3 and an externally generated bias voltage VBN. The bias voltages VBP and VBN are supplied by appropriate external bias circuitry (not shown, but which could, for example, use a replica technique as is well known in the art) such that the zero input current operating point of the amplifier is the same as that of inverter 10 and such that the crowbar current flowing through inverter 10 at this operating point is relatively constant, regardless of process or power supply variations.

Capacitor C0 is connected between node A and AVDD, bypassing transistor M2. Capacitor C1 is connected between node B and AVSS, bypassing transistor M3. Capacitors C0, C1 decrease the AC impedance of nodes A and B, as seen by transistors M0, M1 respectively. This prevents the current-source operation of transistors M2, M3 from reducing the AC gain of inverter 10. To decrease the effective DC impedance at nodes A and B, the gate voltage applied to transistors M2, M3 is modified by resistor network 20 formed by the aforementioned resistors R1, R2, R3, and R4.

The ratio of the resistance value of resistor R1 to the resistance value of resistor R2 is selected to equal to the ratio of the resistance value of resistor R3 to the resistance value of resistor R4 (i.e. R1/R2=R3/R4), and is selected such that the low-frequency gain provided by transistors M2, M3 equals the high frequency gain provided by transistors M0, M1. Two main factors define the choice for the sum of the resistance values of resistors R1 and R2. The lower bound is set by the bias generation circuitry which must drive the DC load on bias voltages VBP and VBN. The upper bound is determined by the consideration that the poles formed by resistor network 20 and the gates of transistors M2, M3 must not be too low. Poles of too low a frequency would require larger capacitors C0, C1 to maintain constant gain over the frequency range. Larger capacitors would consume more integrated circuit chip area, which is undesirable.

As will be apparent to those skilled in the art in the light of the foregoing disclosure, many alterations and modifications are possible in the practice of this invention without departing from the spirit or scope thereof. For example, the resistor network need not be constructed of resistors, but could be replaced with a network of other resistive elements, such as appropriately biased MOSFETs. Accordingly, the scope of the invention is to be construed in accordance with the substance defined by the following claims.

What is claimed is:

1. A transresistance amplifier, comprising:

(a) an inverter having an input terminal, an output terminal, a first voltage supply terminal, and a second voltage supply terminal;

(b) a feedback resistor electrically connected between said output terminal and said input terminal;

(c) a first starvation transistor electrically connected between said first voltage supply terminal and a positive DC power supply voltage source;

(d) a second starvation transistor electrically connected between said second voltage supply terminal and a ground potential;

(e) a first resistive element having a resistance value R1 electrically connected between a gate of said first starvation transistor and a first bias voltage source for providing a first bias voltage;

(f) a second resistive element having a resistance value R2 electrically connected between said first starvation transistor gate and said input terminal;

(g) a third resistive element having a resistance value R3 electrically connected between a gate of said second starvation transistor and a second bias voltage source for providing a second bias voltage;

(h) a fourth resistive element having a resistance value R4 electrically connected between said second starvation transistor gate and said input terminal;

(i) a first capacitor having a capacitance value C1 electrically connected between a drain of said first starvation transistor and said positive DC power supply; and, (j) a second capacitor having a capacitance value C2 electrically connected between a drain of said second starvation transistor and said ground potential.

2. A transresistance amplifier as defined in claim 1, wherein said inverter comprises:

(a) a PMOS transistor having a gate electrically connected to said input terminal, a drain electrically connected to said output terminal, and a source electrically connected to said first voltage supply terminal; and, (b) an NMOS transistor having a gate electrically connected to said input terminal, a drain electrically connected to said output terminal, and a source electrically connected to said second voltage supply terminal.

3. A transresistance amplifier as defined in claim 2, wherein:
   (a) said first starvation transistor is a PMOS transistor; and,
   (b) said second starvation transistor is an NMOS transistor.

4. A transresistance amplifier as defined in claim 3, wherein:
   (a) a drain of said first starvation transistor is electrically connected to said first voltage supply terminal;
   (b) a source of said first starvation transistor is electrically connected to said positive DC power supply voltage source;
   (c) a drain of said second starvation transistor is electrically connected to said second voltage supply terminal; and,
   (d) a source of said second starvation transistor is electrically connected to said ground potential.

5. A transresistance amplifier as defined in claim 2, wherein:
   (a) said transresistance amplifier has a low frequency gain and a high frequency gain;
   (b) said low frequency gain is determined by said resistive elements and by said first and second starvation transistors;
   (c) said high frequency gain is determined by said inverter PMOS transistor and said inverter NMOS transistor; and,
   (d) the ratios R1/R2 and R3/R4 are selected such that said low frequency gain is equivalent to said high frequency gain.

6. A transresistance amplifier as defined in claim 1, wherein:
   (a) said transresistance amplifier has a gain characteristic determined by poles formed by said first, second, third, and fourth resistive elements and by said first and second starvation transistor gates;
   (b) said transresistance amplifier has a gain characteristic zero determined by zeroes formed by said first and second capacitors and by said inverter; and,
   (c) the values R1+R2 and R3+R4, and said values C1, C2 are selected to yield an overall gain characteristic of said transresistance amplifier which is constant over frequency.

7. A transresistance amplifier as defined in claim 1, wherein:
   (a) said transresistance amplifier has a zero input current operating point in response to zero input current;
   (b) said inverter and said feedback resistor together form a structure having a zero input current operating point in response to zero input current; and,
   (c) said first and second bias supply voltages are selected such that said transresistance amplifier zero input current operating point equals said structure zero input current operating point.

8. A transresistance amplifier as defined in claim 7, wherein said first and second bias supply voltages are selected such that crowbar current flowing through said transresistance amplifier at said transresistance amplifier zero input current operating point is substantially constant notwithstanding process and power supply variation.

9. A transresistance amplifier as defined in claim 8, wherein the value R1+R2 and the value R3+R4 are selected to enable said first and second bias supply voltage sources to drive said first and second bias voltages respectively.

* * * * *